United States Patent
Hsiao et al.

(10) Patent No.: US 9,934,087 B2
(45) Date of Patent: Apr. 3, 2018

(54) DECODING METHOD, MEMORY STORAGE DEVICE AND MEMORY CONTROL CIRCUIT UNIT

(71) Applicant: EpoStar Electronics Corp., Hsinchu (TW)

(72) Inventors: Yu-Hua Hsiao, Hsinchu County (TW); Heng-Lin Yen, Hsinchu County (TW)

(73) Assignee: EpoStar Electronics Corp., Hsinchu (TW)

( * ) Notice: Subject to any disclaimer, the term of this patent is extended or adjusted under 35 U.S.C. 154(b) by 33 days.

(21) Appl. No.: 15/185,034

(22) Filed: Jun. 17, 2016

(65) Prior Publication Data

US 2017/0308432 A1  Oct. 26, 2017

(30) Foreign Application Priority Data

Apr. 22, 2016  (TW) .............................. 105112619 A

(51) Int. Cl.
*G06F 11/10* (2006.01)
*H03M 13/09* (2006.01)
(Continued)

(52) U.S. Cl.
CPC .......... *G06F 11/1068* (2013.01); *G11C 16/10* (2013.01); *G11C 16/26* (2013.01);
(Continued)

(58) Field of Classification Search
CPC ............. G06F 11/1048; G06F 11/1068; G06F 11/1072; G06F 11/1012; G11C 16/10;
(Continued)

(56) References Cited

U.S. PATENT DOCUMENTS 9,639,419 B2 * 5/2017 Lin ..................... G06F 11/1048
2014/0355340 A1 12/2014 Sharon et al.
(Continued)

FOREIGN PATENT DOCUMENTS

TW  I447731  8/2014
TW  201511016  3/2015

OTHER PUBLICATIONS

"Office Action of Taiwan Counterpart Application," dated Jan. 10, 2017, p. 1-p. 10.

*Primary Examiner* — Shelly A Chase
(74) *Attorney, Agent, or Firm* — JCIPRNET

(57) ABSTRACT

A decoding method, a memory storage device and a memory control circuit unit are provided. The decoding method includes: reading a target physical unit based on a first read voltage level; performing a first decoding operation; reading an authentication physical unit based on a first candidate voltage level to obtain first assistance data and reading the authentication physical unit based on a second candidate voltage level to obtain second assistance data if the first decoding operation fails; obtaining a first estimation parameter according to the first assistance data and authentication data and obtaining a second estimation parameter according to the second assistance data and the authentication data; determining a second read voltage level according to the first estimation parameter and the second estimation parameter; and reading the target physical unit again based on the second read voltage level. Accordingly, the decoding efficiency may be improved.

21 Claims, 9 Drawing Sheets

(51) Int. Cl.
*G11C 29/52* (2006.01)
*G11C 29/36* (2006.01)
*G11C 29/38* (2006.01)
*G11C 29/44* (2006.01)
*G11C 16/26* (2006.01)
*G11C 16/10* (2006.01)

(52) U.S. Cl.
CPC .............. *G11C 29/36* (2013.01); *G11C 29/38* (2013.01); *G11C 29/44* (2013.01); *G11C 29/52* (2013.01)

(58) Field of Classification Search
CPC ......... G11C 16/26; G11C 29/42; G11C 29/44; G11C 29/52; H03M 13/1108; H03M 13/152; H03M 13/1191; H03M 13/1515
See application file for complete search history.

(56) References Cited

U.S. PATENT DOCUMENTS

2015/0186212 A1\* 7/2015 Lin ..................... G06F 11/1072 714/764
2015/0381206 A1\* 12/2015 Fainzilber .......... H03M 13/1108 714/758

\* cited by examiner

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 105112619, filed on Apr. 22, 2016. The entirety of the above-mentioned patent application is hereby incorporated by reference herein and made a part of this specification.

BACKGROUND

Technical Field

The disclosure relates to a memory technology, and more particularly, to a decoding method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In general, after data is read from the memory, such data may be decoded in order to ensure a correctness of the data. Accordingly, if there is any error existing in the data, such error can be corrected through a decoding operation. Generally, a default read voltage level is usually configured in the memory device before leaving the factory. The default read voltage level is used for reading data stored in the memory device. However, with increases in usage time and/or wear level of the memory device, errors included in the data read by using the default read voltage level may become increasingly more and even go beyond control of an error correction capability of the decoding operation. Therefore, it is one of the important issues to be addressed by person skilled in the art as how to improve the correctness of the read data and/or a decoding capability of the memory by adjusting the default read voltage level.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure is directed to a decoding method, a memory storage device and a memory control circuit unit, which are capable of improving the correctness of the read data and improving a decoding efficiency of the memory storage device.

An exemplary embodiment of the disclosure provides a decoding method, which is used for a rewritable non-volatile memory module including a plurality of physical units. The decoding method includes: reading a target physical unit among the physical units based on a first read voltage level to obtain first target data; performing a first decoding operation on the first target data; reading an authentication physical unit among the physical units based on a first candidate voltage level to obtain first assistance data and reading the authentication physical unit based on a second candidate voltage level to obtain second assistance data if the first decoding operation fails; obtaining a first estimation parameter according to the first assistance data and authentication data and obtaining a second estimation parameter according to the second assistance data and the authentication data; determining a second read voltage level according to the first estimation parameter and the second estimation parameter; reading the target physical unit based on the second read voltage level to obtain second target data; and performing a second decoding operation on the second target data.

Another exemplary embodiment of the disclosure provides a memory storage device, which includes a connection interface unit, a rewritable non-volatile memory module and a memory control circuit unit. The connection interface unit is configured to couple to a host system. The rewritable non-volatile memory module includes a plurality of physical units. The memory control circuit unit is coupled to the connection interface unit and the rewritable non-volatile memory module. The memory control circuit unit is configured to send a first read command sequence to instruct reading a target physical unit among the physical units based on a first read voltage level to obtain first target data. The memory control circuit unit is further configured to perform a first decoding operation on the first target data. The memory control circuit unit is further configured to send a first test command sequence to instruct reading an authentication physical unit among the physical units based on a first candidate voltage level to obtain first assistance data and send a second test command sequence to instruct reading the authentication physical unit based on a second candidate voltage level to obtain second assistance data if the first decoding operation fails. The memory control circuit unit is further configured to obtain a first estimation parameter according to the first assistance data and authentication data and obtain a second estimation parameter according to the second assistance data and the authentication data. The memory control circuit unit is further configured to determine a second read voltage level according to the first estimation parameter and the second estimation parameter. The memory control circuit unit is further configured to send a second read command sequence to instruct reading the target physical unit based on the second read voltage level to obtain second target data. The memory control circuit unit is further configured to perform a second decoding operation on the second target data.

Another exemplary embodiment of the disclosure provides a memory control circuit unit, which is configured to control a rewritable non-volatile memory module having a plurality of physical units. The memory control circuit unit includes a host interface, a memory interface, an error checking and correcting circuit, and a memory management circuit. The host interface is configured to couple to a host system. The memory interface is configured to couple to the rewritable non-volatile memory module. The memory management circuit is coupled to the host interface, the memory interface and the error checking and correcting circuit. The memory management circuit is configured to send a first read command sequence to instruct reading a target physical unit among the physical units based on a first read voltage level to obtain first target data. The error checking and correcting circuit is configured to perform a first decoding operation on the first target data. The memory management circuit is further configured to send a first test command sequence to instruct reading an authentication physical unit among the physical units based on a first candidate voltage level to obtain first assistance data and send a second test command sequence to instruct reading the authentication physical unit based on a second candidate voltage level to obtain second assistance data if the first decoding operation fails. The memory management circuit is further configured to obtain a first estimation parameter according to the first assistance data and authentication data and obtain a second estimation parameter according to the second assistance data and the authentication data. The memory management circuit is further configured to determine a second read voltage level according to the first estimation parameter and the second estimation parameter. The memory management circuit is further configured to send a second read command sequence to instruct reading the target physical unit based on the second read voltage level to obtain second target data. The error checking and correcting circuit is further configured to perform a second decoding operation on the second target data.

Based on the above, a read voltage level is used to read the target physical unit to obtain the target data and the target data is then decoded. If the decoding operation for the target data fails, multiple candidate voltage levels are used to read the authentication physical unit to obtain the assistance data. Multiple estimation parameters may be obtained after comparing the obtained assistance data with the authentication data. According to the obtained estimation parameters, another read voltage level is determined and used to read the same target physical unit again. As a result, the correctness of the read data may be improved and the decoding efficiency of the memory storage device may also be improved.

To make the above features and advantages of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
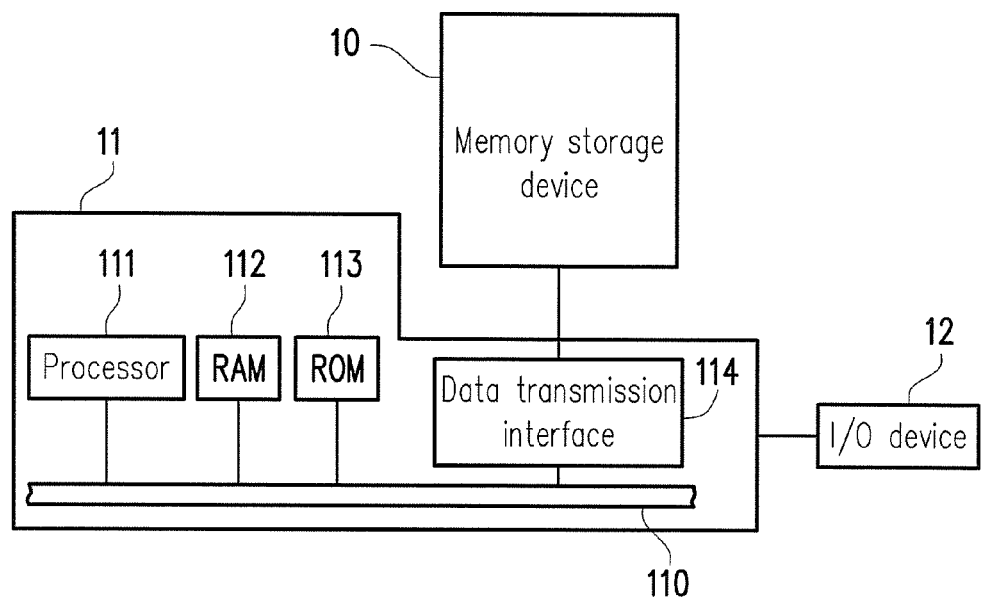
FIG. 1 is a schematic diagram illustrating a host system, a memory storage device and an I/O (input/output) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, the memory storage device (also known as a memory storage system) includes a rewritable non-volatile memory module and a controller (also known as a control circuit). The memory storage device is usually configured to cooperate with a host system so the host system may write data into the memory storage device or receive data from the memory storage device.

Figure 2:
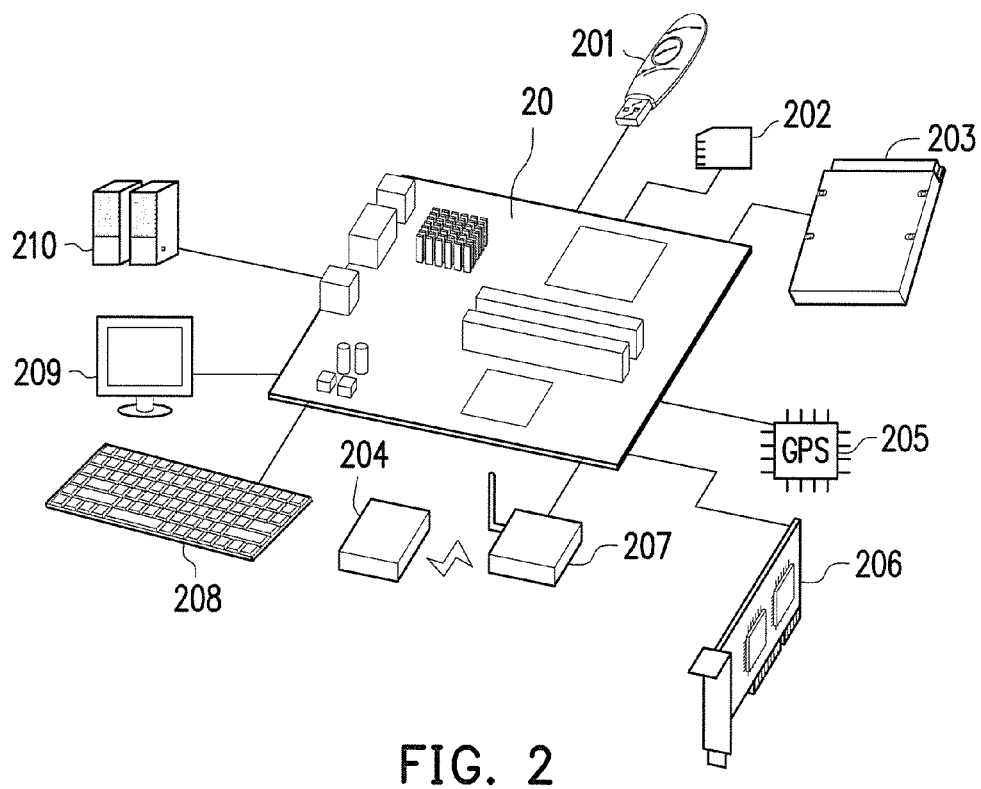
FIG. 2 is a schematic diagram illustrating a host system, a memory storage device and an I/O device according to another exemplary embodiment of the disclosure.

FIG. 1 is a schematic diagram illustrating a host system, a memory storage device and an I/O (input/output) device according to an exemplary embodiment of the disclosure. FIG. 2 is a schematic diagram illustrating a host system, a memory storage device and an I/O device according to another exemplary embodiment of the disclosure.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or receive data from the memory storage device 10 through the data transmission interface 114. Further, the host system 11 is coupled to an I/O device 12 through the system bus 110. For example, the host system 11 can transmit output signals to the I/O device 12 or receive input signals from I/O device 12 through the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices, such as a GPS (Global Positioning System) module 205, a network interface card 206, a wireless transmission device 207, a keyboard 208, a monitor 209 and/or a speaker 210 through the system bus 110. For example, in an exemplary embodiment, the main board 20 may access the wireless memory storage device 204 through the wireless transmission device 207.

Figure 3:
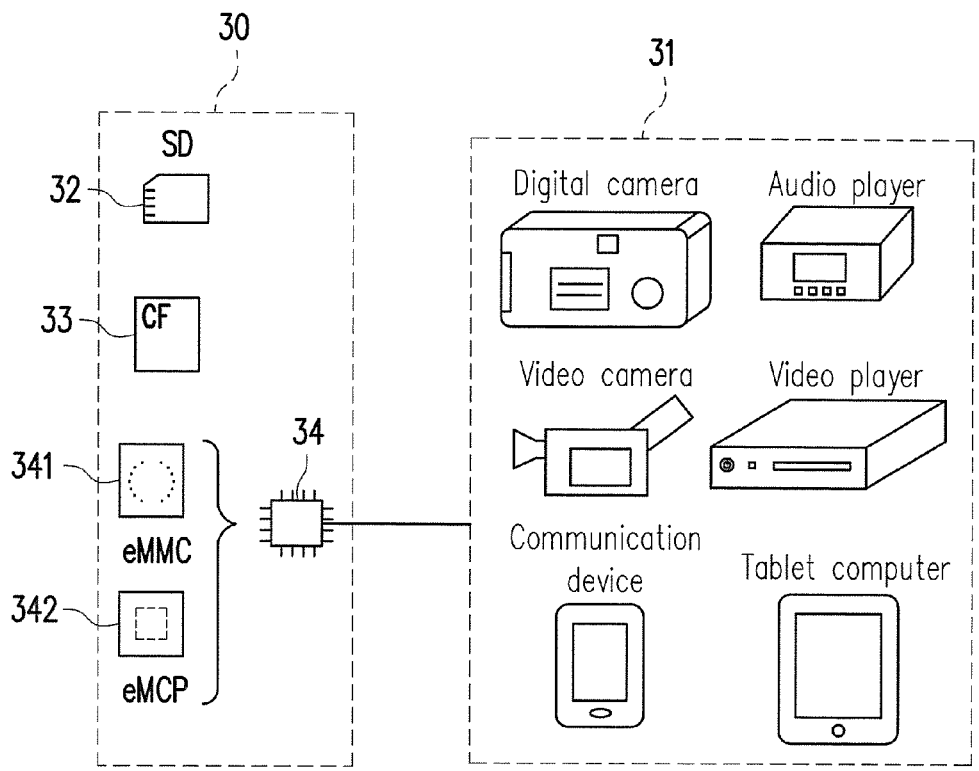
FIG. 3 is a schematic diagram illustrating a host system and a memory storage device according to another exemplary embodiment of the disclosure.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the disclosure. Referring to FIG. 3, in another exemplary embodiment, a host system 31 may also be a system, such as a digital camera, a video camera, a communication device, an audio player, a video player or a tablet computer, whereas a memory storage device 30 may be various non-volatile memory storage devices used by the host system, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) storage device 342.

Figure 4:
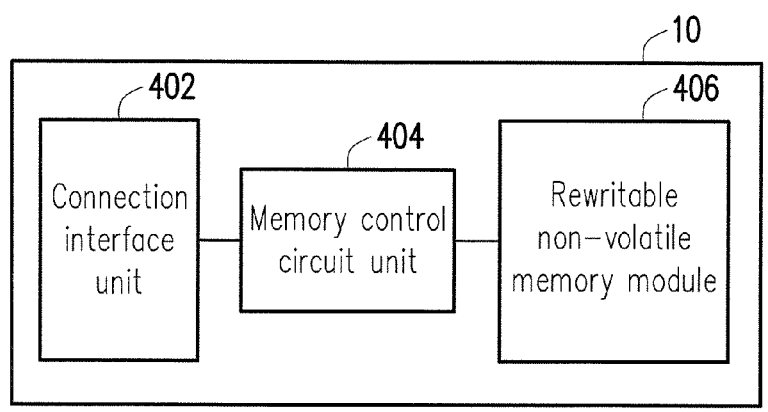
FIG. 4 is a schematic block diagram illustrating a memory storage device according to an exemplary embodiment of the disclosure.

FIG. 4 is a schematic block diagram illustrating a memory storage device according to an exemplary embodiment of the disclosure.

Referring to FIG. 4, the memory storage device 10 includes a connection interface unit 402, a memory control circuit unit 404 and a rewritable non-volatile memory module 406.

The connection interface unit 402 is configured to be coupled to the host system 11. In the present exemplary embodiment, the connection interface unit 402 is compatible with a SATA (Serial Advanced Technology Attachment) standard. Nevertheless, it should be understood that the disclosure is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 may be distributed outside of a chip containing the memory control circuit unit 404.

The memory control circuit unit 404 is configured to execute a plurality of logic gates or control commands which are implemented in a hardware form or in a firmware form and perform operations, such as writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage is also known as "writing data into the memory cell" or "programming the memory cell". Each of the memory cells in the rewritable non-volatile memory module 406 has a plurality of storage states depended on changes in the threshold voltage. The storage state to which the memory cell belongs may be determined by applying a read voltage to the memory cell, so as to obtain the one or more bits stored in the memory cell.

Figure 5:
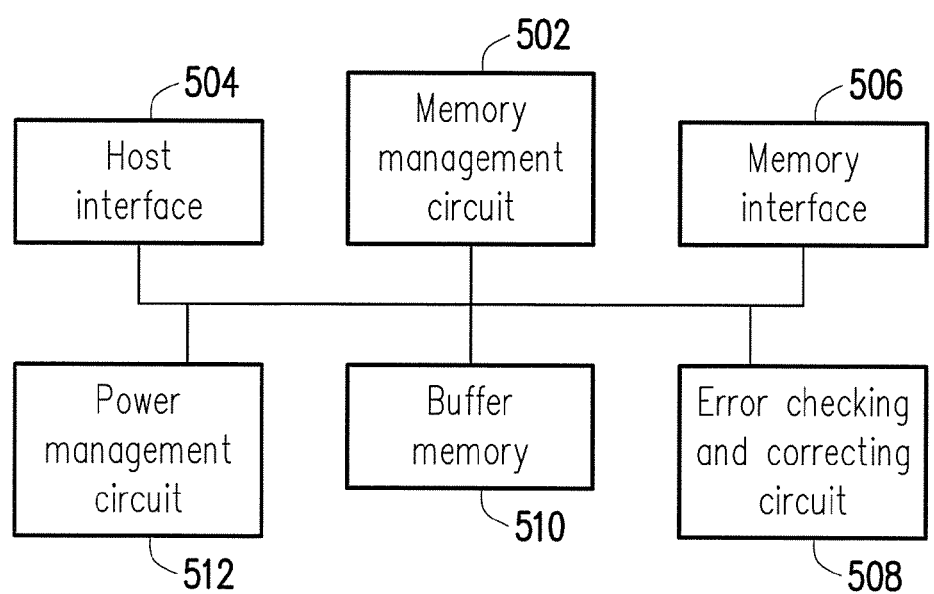
FIG. 5 is a schematic block diagram illustrating a memory control circuit unit according to an exemplary embodiment of the disclosure.

FIG. 5 is a schematic block diagram illustrating a memory control circuit unit according to an exemplary embodiment of the disclosure.

Referring to FIG. 5, the memory control circuit unit 404 includes a memory management circuit 502, a host interface 504, a memory interface 506 and an error checking and correcting circuit 508.

The memory management circuit 502 is configured to control overall operations of the memory control circuit unit 404. Specifically, the memory management circuit 502 has a plurality of control commands and the control commands are executed to perform various operations such as writing, reading and erasing data when the memory storage device 10 operates. Hereinafter, operations of the memory management circuit 502 are described as equivalent to describe operations of the memory control circuit unit 404.

In the present exemplary embodiment, the control commands of the memory management circuit 502 are implemented in form of firmware. For instance, the memory management circuit 502 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations, such as writing, reading or erasing data.

Further, in another exemplary embodiment, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to issue a write command sequence for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 406 in order to erase data from the rewritable non-volatile memory module 406. The data processing circuit is configured to process both the data to be written into the rewritable non-volatile memory module 406 and the data to be read from the rewritable non-volatile memory module 406. Each of the write command sequence, the read command sequence and the erase command sequence may include one or more program codes or command codes and instruct the rewritable non-volatile memory module 406 to perform the corresponding operations, such as writing, reading and erasing. In an exemplary embodiment, the memory management circuit 502 may further issue command sequence of other types to the rewritable non-volatile memory module 406 for instructing to perform the corresponding operations.

The host interface 504 is coupled to the memory management circuit 502 and configured to receive and identify commands and data sent from the host system 11. In other words, the commands and data transmitted by the host system 11 are transmitted to the memory management circuit 502 through the host interface 504. In the present exemplary embodiment, the host interface 504 is compatible with the SATA standard. However, it should be understood that the present disclosure is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written to the rewritable non-volatile memory module 406 is converted into a format acceptable by the rewritable non-volatile memory module 406 through the memory interface 506. Specifically, if the memory management circuit 502 intends to access the rewritable non-volatile memory module 406, the memory interface 506 sends corresponding command sequences. For example, the command sequences may include the write command sequence which instructs to write data, the read command sequence which instructs to read data, the erase command sequence which instructs to erase data, and other corresponding command sequences configured to instruct performing various memory operations (e.g., changing a read voltage level or performing a garbage collection operation). These command sequences are generated by the memory management circuit 502 and transmitted to the rewritable non-volatile memory module 406 through the memory interface 506, for example. The command sequences may include one or more signals, or data transmitted on the bus. The signals or the data may include command codes and program codes. For example, in a read command sequence, information such as identification codes and memory addresses are included.

The error checking and correcting circuit 508 is coupled to the memory management circuit 502 and configured to perform an error checking and correcting operation to ensure the correctness of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data corresponding to the write command and the corresponding ECC and/or the EDC into the rewritable non-volatile memory module 406. Then, when the memory management circuit 502 reads the data from the rewritable non-volatile memory module 406, the corresponding ECC and/or the EDC are also read, and the error checking and correcting circuit 508 performs the error checking and correcting operation on the read data based on the ECC and/or the EDC.

In the present exemplary embodiment, the error checking and correcting circuit 508 encodes and decodes based on a low density parity code (LDPC) code. However, in another exemplary embodiment, the error checking and correcting circuit 508 may also encode and decode based on various codes such as a BCH code, a convolutional code, a turbo code or so on.

In an exemplary embodiment, the memory control circuit unit 404 further includes a buffer memory 510 and a power management circuit 512.

The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

Figure 6:
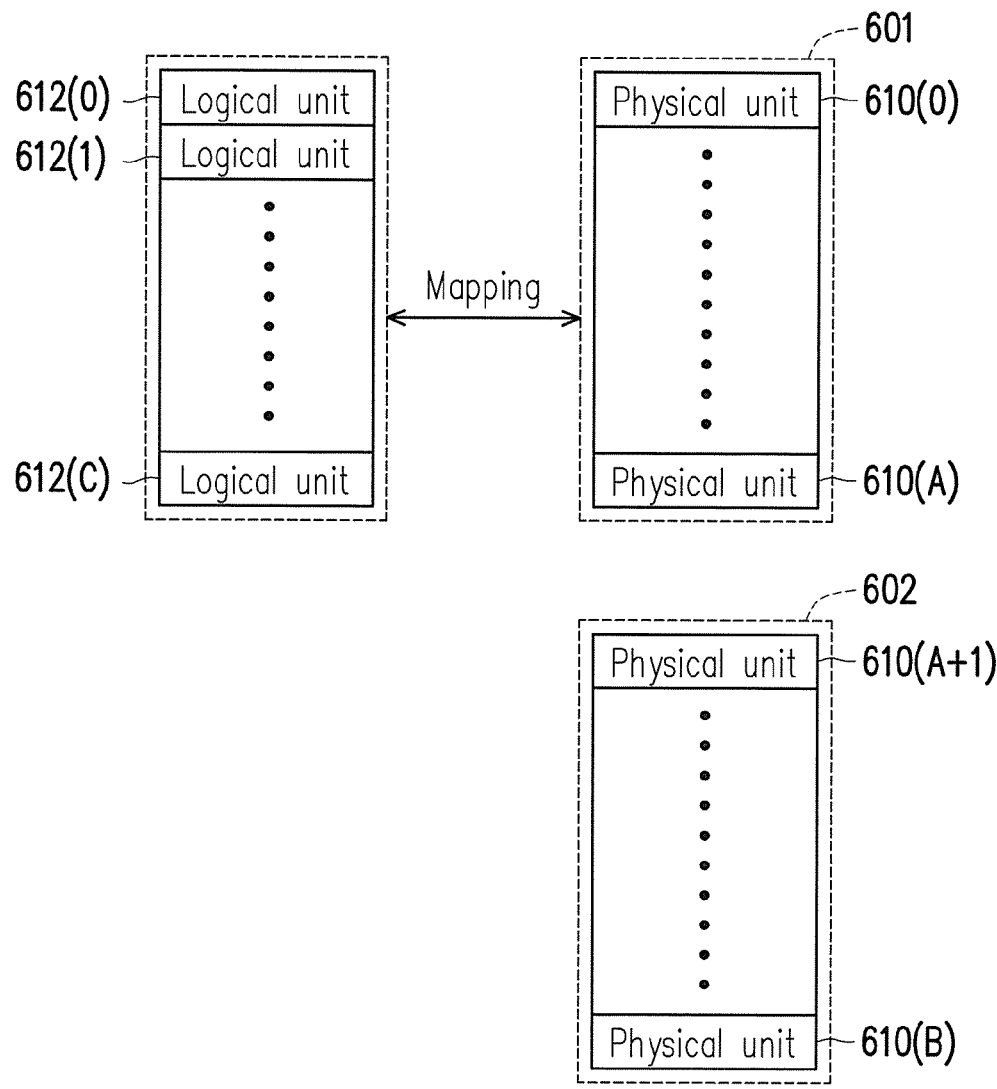
FIG. 6 is a schematic diagram illustrating management of a rewritable non-volatile memory module according to an exemplary embodiment of the disclosure.

FIG. 6 is a schematic diagram illustrating management of a rewritable non-volatile memory module according to an exemplary embodiment of the disclosure. It should be understood that terms, such as "select" and "group", are logical concepts which describe operations in the physical units of the rewritable non-volatile memory module 406. That is to say, the physical units of the rewritable non-volatile memory module 406 are logically operated while actual locations of the physical units of the rewritable non-volatile memory module 406 remain unchanged.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store more than one bit, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is a minimum unit for programming. That is, the physical programming unit is the minimum unit for writing data. For example, the physical programming unit is a physical page or a physical sector. When the physical programming unit is the physical page, the physical programming unit usually includes a data bit area and a redundancy bit area. The data bit area includes multiple physical sectors configured to store user data, and the redundant bit area is configured to store system data (e.g., an error correcting code). In the present exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimal unit for erasing. Namely, each physical erasing unit contains the least number of memory cells to be erased together. For instance, the physical erasing unit is a physical block.

Referring to FIG. 6, the memory management circuit 502 logically groups physical units 610(0) to 610(B) of the rewritable non-volatile memory module 406 into a storage area 601 and a replacement area 602. The physical units 610(0) to 610(A) in the storage area 601 are configured to store data, and the physical units 610(A+1) to 610(B) in the replacement area 602 are configured to replace damaged physical units in the storage area 601. For example, the physical units are replaced by using one physical erasing unit as a unit. In the present exemplary embodiment, each of the physical units 610(0) to 610(B) refers to at least one physical programming unit. Alternatively, in another exemplary embodiment, each of the physical units 610(0) to 610(b) may also include any number of the memory cells.

The memory management circuit 502 configures logical units 612(0) to 612(C) for mapping at least a part of the physical units 610(0) to 610(A) in the storage area 601. In the present exemplary embodiment, the host system 11 accesses the data stored in the storage area 601 through a logical address (LA). Therefore, each of the logical units 612(0) to 612(C) refers to one logical address. However, in another exemplary embodiment, each of the logical units 612(0) to 612(C) may also refer to one logical programming unit, one logical erasing unit or a composition of a plurality of consecutive or non-consecutive logical addresses, depending on practical requirements. In addition, each of the logical units 612(0) to 612(C) may also be mapped to one or more physical units.

In the present exemplary embodiment, the memory management circuit 502 records a mapping relation (also known as a logical-physical mapping relation) between the logical units and the physical units into at least one logical-physical mapping table. When the host system 11 intends to read the data from the memory storage device 10 or write the data into the memory storage device 10, the memory management circuit 502 may access the data in the memory storage device 10 according to the logical-physical mapping table.

Figure 7:
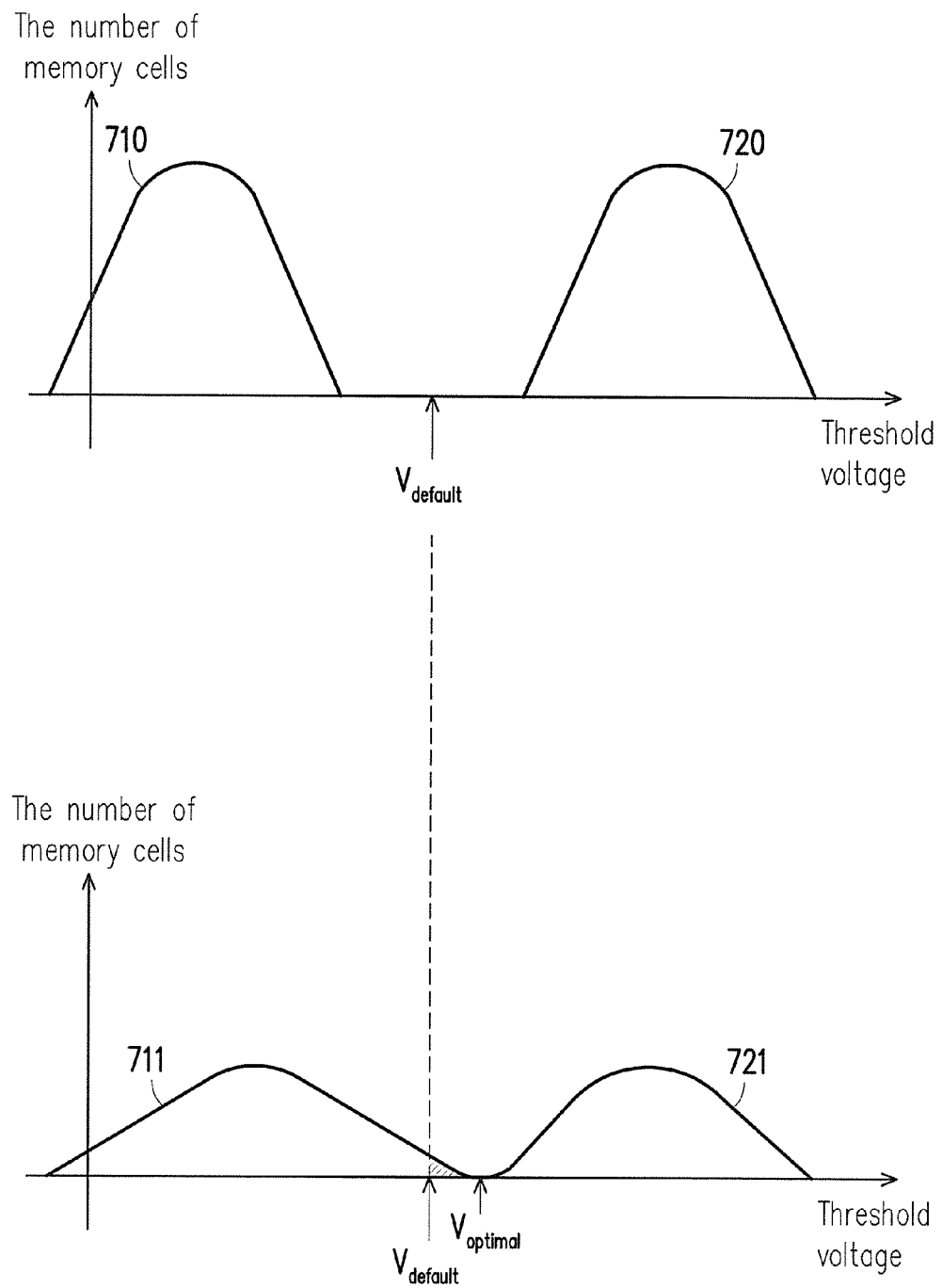
FIG. 7 is a schematic diagram illustrating threshold voltage distributions of memory cells in a physical unit according to an exemplary embodiment of the disclosure.

FIG. 7 is a schematic diagram illustrating threshold voltage distributions of memory cells in a physical unit according to an exemplary embodiment of the disclosure. The SLC NAND flash memory is taken as an example in the present exemplary embodiment, whereas a horizontal axis represents the threshold voltage of the memory cells, and a vertical axis represents a number of the memory cells. However, in another exemplary embodiment, FIG. 7 may also be used to represent a part of threshold voltage distributions in the MLC NAND or TLC NAND flash memories.

Referring to FIG. 7, after a specific physical unit in the rewritable non-volatile memory module 406 is programmed, the threshold voltage of each memory cell in the specific physical unit belongs to one of distributions 710 and 720. For example, if one specific memory cell is used to store the bit "1", the threshold voltage of the specific memory cell falls within the distribution 710; if one specific memory cell is used to store the bit "0", the threshold voltage of the specific memory cell falls within the distribution 720.

It is noted that, in the present exemplary embodiment, each memory cell is configured to store one bit, and thus the threshold voltages of the memory cells can fall within two possible distributions (e.g., the distributions 710 and 720). However, in other exemplary embodiments, if one memory cell is configured to store a plurality of bits, the corresponding threshold voltages can fall within four (e.g., the MLC NAND flash memory), eight (e.g., the TLC NAND flash memory), or any other number of possible distributions. In addition, the bit represented by each distribution is not particularly limited in the disclosure. For example, in another exemplary embodiment of FIG. 7, the distribution 710 may represent the bit "0", and the distribution 720 may represent the bit "1".

Generally, when it is intended to read data stored in the physical unit, the memory management circuit 502 may send one read command sequence to the rewritable non-volatile memory module 406. The read command sequence is configured to instruct reading a physical address of the specific physical unit based on a default read voltage level. According to the read command sequence, the rewritable non-volatile memory module 406 may use a default read voltage level $V_{default}$ to read the memory cells in the specific physical unit and transmit the obtained data to the memory management circuit 502. For example, if the threshold voltage of one specific memory cell is less than the default read voltage level $V_{default}$ (e.g., the memory cell with the threshold voltage belonging to the distribution 710), the memory management circuit 502 reads the bit "1"; if the threshold voltage of one specific memory cell is greater than the default read voltage level $V_{default}$ (e.g., the memory cell with threshold voltage belonging to the distribution 720), the memory management circuit 502 reads the bit "0".

However, with increases in usage time of the rewritable non-volatile memory module 406, a performance degradation may occur on the memory cells in the rewritable non-volatile memory module 406. For example, after the performance degradation has occurred on the memory cells belonging to the distributions 710 and 720, the distributions 710 and 720 may gradually move close to each other or even overlap with each other. For example, a distribution 711 and a distribution 721 in FIG. 7 are used to represent the distributions 710 and 720 respectively after the performance degradation has occurred.

After the performance degradation has occurred, if the default read voltage level $V_{default}$ is continuously used to read the memory cells within the same physical unit, the read data may include a lot of errors. Taking the distributions 711 and 721 in FIG. 7 for example, the memory cells within a slash area still belong to the distribution 711 and yet have the threshold voltages already higher than the default read voltage level $V_{default}$. Therefore, if the default read voltage level $V_{default}$ is continuously used to read those memory cells, a part of the memory cells actually stored with the bit "1" (e.g., the memory cells within the slash area in the distribution 711) may be misjudged as those stored with the bit "0". However, if a read voltage level $V_{optimal}$ is used to read the memory cells in said physical unit instead, errors included in the read data may be significantly reduced.

Figure 8:
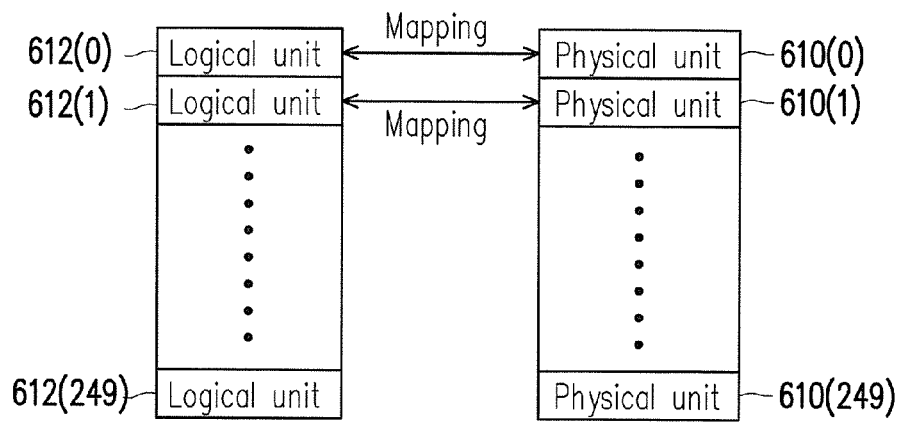
FIG. 8 is a schematic diagram illustrating management of physical units according to an exemplary embodiment of the disclosure.

FIG. 8 is a schematic diagram illustrating management of physical units according to an exemplary embodiment of the disclosure.

Referring to FIG. 8, the memory management circuit 502 selects at least one physical unit to serve as an authentication physical unit and stores specific data into the authentication physical unit. Herein, the data being stored into the authentication physical unit is also known as authentication data. For example, the memory management circuit 502 selects the physical unit 610(0) to serve as the authentication physical unit and stores data belonging to the logical unit 612(0) (i.e., the authentication data) into the physical unit 610(0). By doing so, the logical unit 612(0) is mapped to the physical unit 610(0).

After receiving a write command indicating storing specific data into the logical unit 612(1) from the host system 11, the memory management circuit 502 instructs to store the specific data into the physical unit 610(1) and maps the logical unit 612(1) to the physical unit 610(1). Then, at a specific time point, the memory management circuit 502 may receive a read command for reading the data stored in the logical unit 612(1) from the host system 11. According to the read command, the memory management circuit 502 selects the physical unit 610(1) mapped to the logical unit 612(1) and serves the physical unit 610(1) as a target physical unit corresponding to the read command. The memory management circuit 502 sends a read command sequence (hereinafter, also known as a first read command sequence) to the rewritable non-volatile memory module 406 to instruct reading the target physical unit (i.e., the physical unit 610(1)) based on a default read voltage level (hereinafter, also known as a first read voltage level) to obtain target data (hereinafter, also known as first target data).

The error checking and correcting circuit 508 performs a decoding operation (hereinafter, also known as a first decoding operation) on the first target data. For example, the first decoding operation can verify the first target data and can be used to correct possible errors included in the first target data. If the first decoding operation succeeds, it means that the first target data does not include any error, and thus the error checking and correcting circuit 508 outputs successfully decoded data. If the first decoding operation fails, it means that the first target data includes too many errors and the error checking and correcting circuit 508 is unable to correct all the errors. Therefore, the memory management circuit 502 sends a plurality of test command sequences to the rewritable non-volatile memory module 406 to instruct reading the authentication physical unit set in advance (i.e., the physical unit 610(0)) based on a plurality of candidate voltage levels in order to obtain corresponding assistance data.

In the present exemplary embodiment, the test command sequences include N test command sequences, where N is a positive integer greater than 1. According to a first test command sequence among the N test command sequences, the rewritable non-volatile memory module 406 reads the physical unit 610(0) based on a first candidate voltage level and returns the read data which is served as first assistance data. According to a second test command sequence among the N test command sequences, the rewritable non-volatile memory module 406 reads the physical unit 610(0) based on a second candidate voltage level and returns the read data which is served as second assistance data. Herein, the first candidate voltage level is different from the second candidate voltage level. In other words, according to the N test command sequences, N assistance data may be correspondingly obtained.

The memory management circuit 502 analyzes the N assistance data one by one based on the original authentication data and obtains N estimation parameters according to analyzed results. In the present exemplary embodiment, each of the estimation parameters includes a flipping bit count. The flipping bit count corresponds to a total umber of error bit(s) in one assistance data. For example, by comparing the authentication data originally stored in the authentication physical unit (i.e., the authentication data regarded as not including any errors) with the assistance data subsequently read from the authentication physical unit (i.e., the authentication data possibly including errors due to influences from the channels), all or most of error bits in the assistance data may be located. Then, the memory management circuit 502 counts the located error bits to serve as the flipping bit count corresponding to the assistance data and sets an estimation parameter corresponding to the flipping bit count to represent the total number of the error bit and/or the correctness of the assistance data. By doing so, the correctness of the corresponding N assistance data can be statistic according to the N estimation parameters (or the flipping bit counts).

In other words, the memory management circuit 502 obtains a first estimation parameter corresponding to the correctness of the first assistance data among the N assistance data according to the first assistance data and the authentication data and obtains a second estimation parameter corresponding to the correctness of the second assistance data among the N assistance data according to the second assistance data and the same authentication data. For example, the first estimation parameter includes a first flipping bit count, and the second estimation parameter includes a second flipping bit count. For example, the first flipping bit count corresponds to a total number of the error bit in the first assistance data, and the second flipping bit count corresponds to a total number of the error bit in the second assistance data.

The memory management circuit 502 determines another read voltage level (hereinafter, also known as a second read voltage level) according to the obtained N estimation parameters. For example, the second read voltage level may be an optimal read voltage level $V_{optimal}$ in FIG. 7. For example, the memory management circuit 502 may find an assistance data read based on one specific candidate read voltage level that includes the least error bits and/or has the highest correctness according to a value relationship between the N estimation parameters (or the flipping bit counts), and accordingly sets the specific candidate read voltage level as the second read voltage level (or the optimal read voltage level). Taking N=2 as an example, the memory management circuit 502 may compare the first flipping bit count with the second flipping bit count. If the first flipping bit count is less than the second flipping bit count, the memory management circuit 502 may set the first candidate voltage level as the second read voltage level. Alternatively, if the second flipping bit count is less than the first flipping bit count, the memory management circuit 502 may set the second candidate voltage level as the second read voltage level. In an exemplary embodiment, the operation of setting the second read voltage level may also be regarded as to update the default read voltage level. For example, the default read voltage level in FIG. 7 may be updated from the voltage level $V_{default}$ to the voltage level $V_{optimal}$.

After determining the second read voltage level, the memory management circuit 502 sends another read command sequence (hereinafter, also known as a second read command sequence) to the rewritable non-volatile memory module 406 to instruct reading the target physical unit (i.e., the physical unit 610(1)) again based on the second read voltage level to obtain another target data (hereinafter, also known as second target data). For example, as compared to the first target data, the second data may include fewer error bits. Then, the error checking and correcting circuit 508 performs another decoding operation (hereinafter, also known as a second decoding operation) on the second target data. As similar to the first decoding operation, the second decoding operation can verify the second target data and can be used to correct possible errors included in the second target data. As a result, a decoding success rate of the memory storage device 10 may be improved by reducing the total number of error bits in the data read from the target physical unit.

Figure 9:
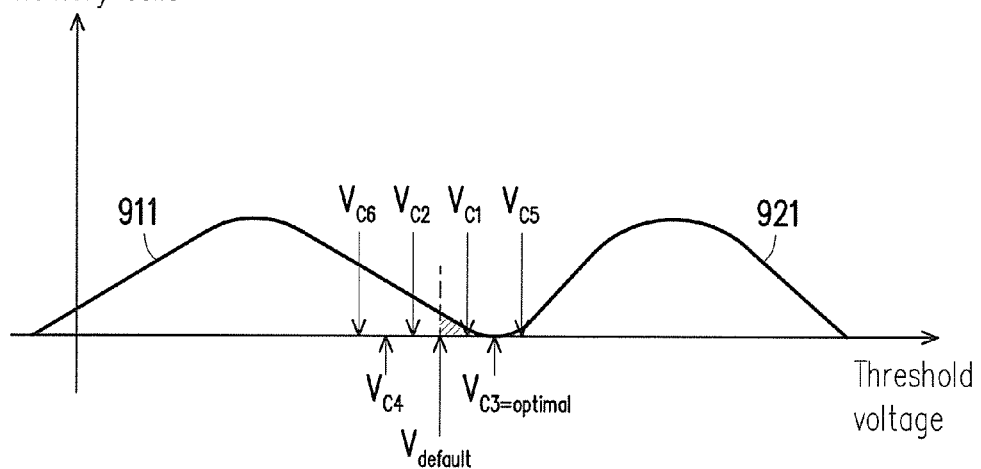
FIG. 9 is a schematic diagram illustrating a plurality of candidate read voltage levels used for reading an authentication physical unit according to an exemplary embodiment of the disclosure.

FIG. 9 is a schematic diagram illustrating a plurality of candidate read voltage levels used for reading an authentication physical unit according to an exemplary embodiment of the disclosure.

Referring to FIG. 9, it is assumed that the threshold voltage distributions of the memory cells in the authentication physical unit (e.g., the physical unit 610(0) in FIG. 8) stored with the authentication data include distributions 911 and 921. Herein, the distribution 911 corresponds to the bit "1", and the distribution 921 corresponds to the bit "0". The memory management circuit 502 may search a lookup table to obtain a plurality of offset values. Herein, a read voltage level $V_{C1}$ is, for example, equal to the default read voltage level $V_{default}$ plus one specific offset value (e.g., +Δ); a read voltage level $V_{C2}$ is, for example, equal to the default read voltage level $V_{default}$ plus one specific offset value (e.g., −Δ); a read voltage level $V_{C3}$ is, for example, equal to the default read voltage level $V_{default}$ plus one specific offset value (e.g., +2Δ); a read voltage level $V_{C4}$ is, for example, equal to the default read voltage level $V_{default}$ plus one specific offset value (e.g., −2Δ); a read voltage level $V_{C5}$ is, for example, equal to the default read voltage level $V_{default}$ plus one specific offset value (e.g., +3Δ); and a read voltage level $V_{C6}$ is, for example, equal to the default read voltage level $V_{default}$ plus one specific offset value (e.g., −3Δ). Each of the read voltage levels $V_{C1}$ to $V_{C6}$ is one of the candidate read voltage levels.

The memory management circuit 502 reads the memory cells in the authentication physical unit based on the read voltage levels $V_{C1}$ to $V_{C6}$ in a specific sequence to obtain six corresponding assistance data. In view of FIG. 9, the assistance data read based on the read voltage level $V_{C3}$ should include the least error bits, theoretically. Nonetheless, from the perspective of the memory management circuit 502, it is highly possible that estimation parameter obtained by comparing the six assistance data one by one with the original authentication data can show the same result (i.e., the assistance data read based on the read voltage $V_{C3}$ includes the least error bits). Therefore, according to the obtained estimation parameter, the read voltage level $V_{C3}$ may be set as the second read voltage level (or the optimal read voltage level) and used to read the target physical unit again, so as to reduce errors included in the obtained target data. However, the above exemplary embodiment of FIG. 9 is just an example, in another exemplary embodiment, after some of the read voltage levels $V_{C1}$ to $V_{C6}$ are used for reading the corresponding assistance data, the correspondingly obtained estimation parameter can be further used for determining a next read voltage level being successively used. For example, after the read voltage levels $V_{C1}$ and $V_{C2}$ are used for reading assistance data, the error bits included in the corresponding assistance data can be obtained based on the authentication data. As shown in FIG. 9, since the error bits included in the assistance data read based on the read voltage levels $V_{C1}$ is less than the error bits included in the assistance data read based on the read voltage levels $V_{C2}$, the read voltage level $V_{C3}$ may be determined as the next read voltage level being used, not the read voltage level $V_{C4}$. In other words, in one exemplary embodiment, according to the obtained assistance data, only one of the offset value gradually increasing (e.g., +2Δ, +3Δ, +4Δ, or so on) and the offset value gradually decreasing (e.g., −2Δ, −3Δ, −4Δ or so on) can be further selected and used for generating the corresponding read voltage level being used successively.

It is noted that, in an exemplary embodiment of FIG. 8, the physical units 610(0) to 610(249) belong to the same physical erasing unit. In other words, the physical unit 610(0) served as the authentication physical unit and the physical unit 610(1) served as the target physical unit belong to the same physical erasing unit. Since the wear level and/or the threshold voltage distributions of the memory cells of any two of the physical units 610(0) to 610(249) may be similar, the memory management circuit 502 may directly set the optimal read voltage level corresponding to the target physical unit (i.e., the physical unit 610(1)) according to the optimal read voltage level (or the corresponding offset value) corresponding to the authentication physical unit (i.e., the physical unit 610(0)). If the target physical unit is any one of the physical units 610(2) to 610(249), the optimal read voltage level (or the corresponding offset value) corresponding to the authentication physical unit (i.e., the physical unit 610(0)) may also be used to set the optimal read voltage level corresponding to the target physical unit. In addition, the number of the authentication physical unit may also be more than one. For example, in another exemplary embodiment of FIG. 8, a plurality of physical units among the physical units 610(0) to 610(249) may also be set as the authentication physical unit.

In another exemplary embodiment of FIG. 8, the physical unit 610(0) served as the authentication physical unit and the physical unit 610(1) served as the target physical unit are constituted by the memory cells on the same word line. For example, if the physical unit 610(0) served as the authentication physical unit is the lower physical programming unit, the physical unit 610(1) served as the target physical unit is the upper physical programming unit corresponding to the physical unit 610(0). Alternatively, if the physical unit 610(1) served as the target physical unit is the lower physical programming unit, the physical unit 610(0) served as the authentication physical unit is the upper physical programming unit corresponding to the physical unit 610(1).

In an exemplary embodiment, the authentication data is stored into one specific authentication physical unit before the corresponding target physical unit is used to store the data to be stored as instructed by the host system 11. However, in another exemplary embodiment, the target physical unit may also be used to store data before the corresponding authentication physical unit is used to store the authentication data.

In an exemplary embodiment, the authentication data includes a preset string. In another exemplary embodiment, the memory management circuit 502 may input a seed to a random number generator in order to generate the authentication data including a random string. Then, the memory management circuit 502 stores said seed and programs the authentication data into the authentication physical unit. When it is required to use the original authentication data, the memory management circuit 502 may input the stored seed to the random number generator again to obtain the original authentication data.

In an exemplary embodiment, the authentication data being stored into the authentication physical unit (or the seed) may be additionally stored in an area with higher reliability in the rewritable non-volatile memory module 406 and/or stored by using an operation mode with higher reliability. For example, the authentication data may be additionally stored by using a SLC mode (i.e., one memory cell only stores one bit). Accordingly, the additionally stored authentication data may be restored based on the highest correctness and used to compare with the assistance data subsequently read from the authentication physical unit.

In an exemplary embodiment, the error checking and correcting circuit 508 may support at least one of a hard-decode mode decoding and a soft-decode mode decoding. In the hard-decode mode decoding, at least one hard bit (also known as hard information) corresponding to each memory cell is adopted. For example, in correspondence to one memory cell stored with one bit (e.g., the bit "1" or "0"), one hard decision voltage level is used to read one hard bit from that memory cell; in correspondence to one memory cell stored with two bits (e.g., the bits "11", "10", "00" or "01"), two hard decision voltage levels are used to read two hard bits from that memory cell; and in correspondence to one memory cell stored with three bits (e.g., the bits "111", "010", "000", and so on), three hard decision voltage levels are used to read three hard bits from that memory cell. However, in the soft-decode mode decoding, a plurality of soft bits (also known as soft information) corresponding to each memory cell are adopted. That is to say, in the soft-decode mode decoding, regardless of how many bits are stored by one memory cell, a plurality of soft decision voltage levels are used to read the soft bits from that memory cell. Accordingly, in comparison with the hard-decode mode decoding, the soft-decode mode decoding may obtain more channel information to thereby increase the decoding success rate. Person skilled in the art should be able to understand what the hard-decode mode decoding and the soft-decode mode decoding can do, and thus the related description regarding the same is not repeated hereinafter.

In an exemplary embodiment, both the first decoding operation and the second decoding operation belong to the hard-decode mode decoding. For example, both the first read voltage level and the second read voltage level are the hard decision voltage level. However, in another exemplary embodiment, the first decoding operation belongs to the hard-decode mode decoding, whereas the second decoding operation belongs to the soft-decode mode decoding. For example, according to the second read command sequence, more soft decision voltage levels may be used to read the target physical unit to obtain the desired soft bits. Furthermore, in another exemplary embodiment, it is also possible that both the first decoding operation and the second decoding operation belong to the soft-decode mode decoding. For example, both the first target data and the second target data include the soft bits read by using multiple soft decision voltage levels.

Figure 10:
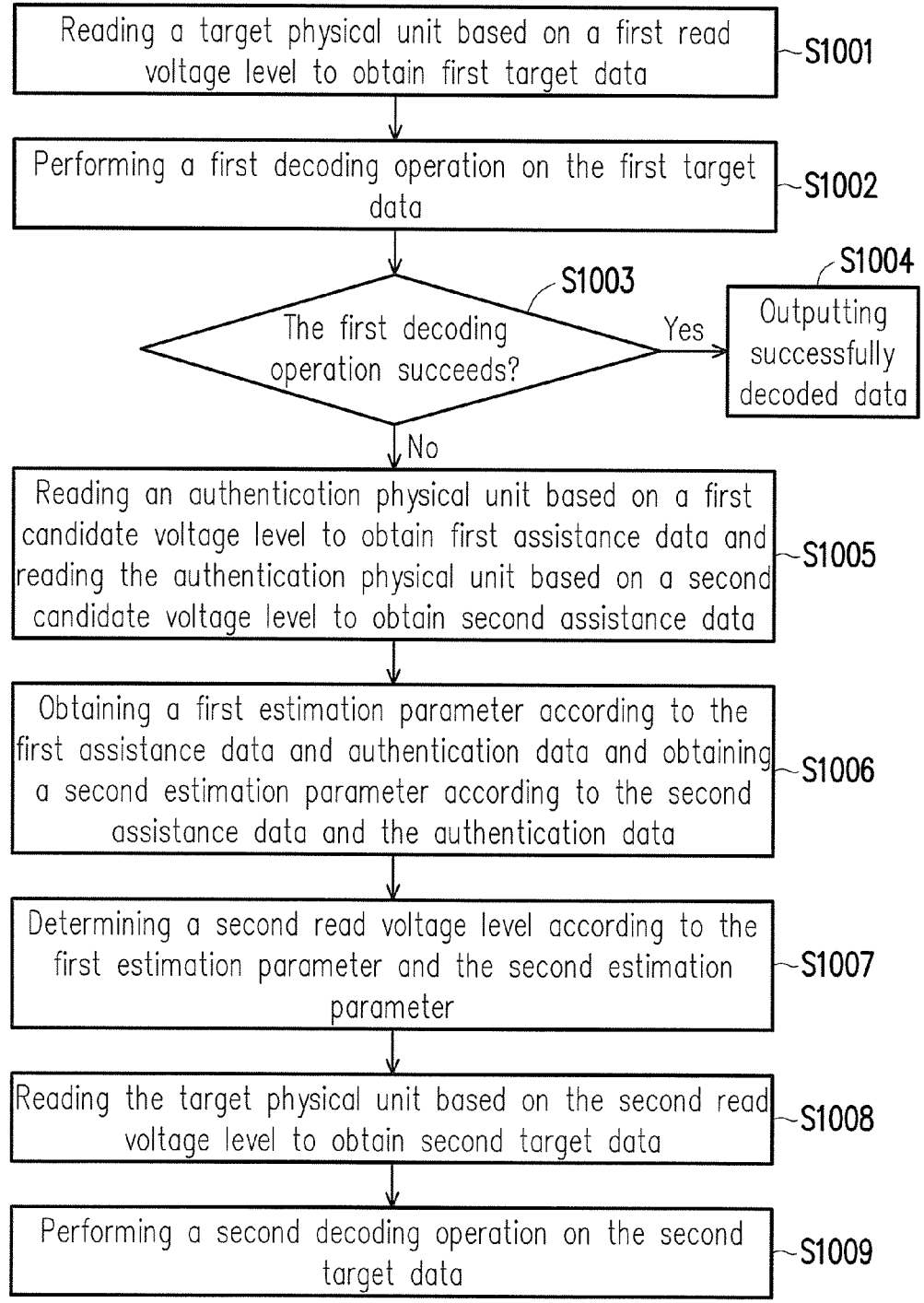
FIG. 10 is a flowchart illustrating a decoding method according to an exemplary embodiment of the disclosure.

FIG. 10 is a flowchart illustrating a decoding method according to an exemplary embodiment of the disclosure.

Referring to FIG. 10, in step S1001, a target physical unit is read based on a first read voltage level to obtain first target data. In step S1002, a first decoding operation is performed on the first target data. In step S1003, whether the first decoding operation succeeds (or fails) is determined. If the first decoding operation succeeds, in step S1004, successfully decoded data is outputted. If the first decoding operation does not succeed (i.e., fails), in step S1005, an authentication physical unit is read based on a first candidate voltage level to obtain first assistance data and the same authentication physical unit is read based on a second candidate voltage level to obtain second assistance data. In step S1006, a first estimation parameter is obtained according to the first assistance data and authentication data and a second estimation parameter is obtained according to the second assistance data and the same authentication data. In step S1007, a second read voltage level is determined according to the first estimation parameter and the second estimation parameter. In step S1008, the target physical unit is read based on the second read voltage level to obtain second target data. In step S1009, a second decoding operation is performed on the second target data.

Figure 11:
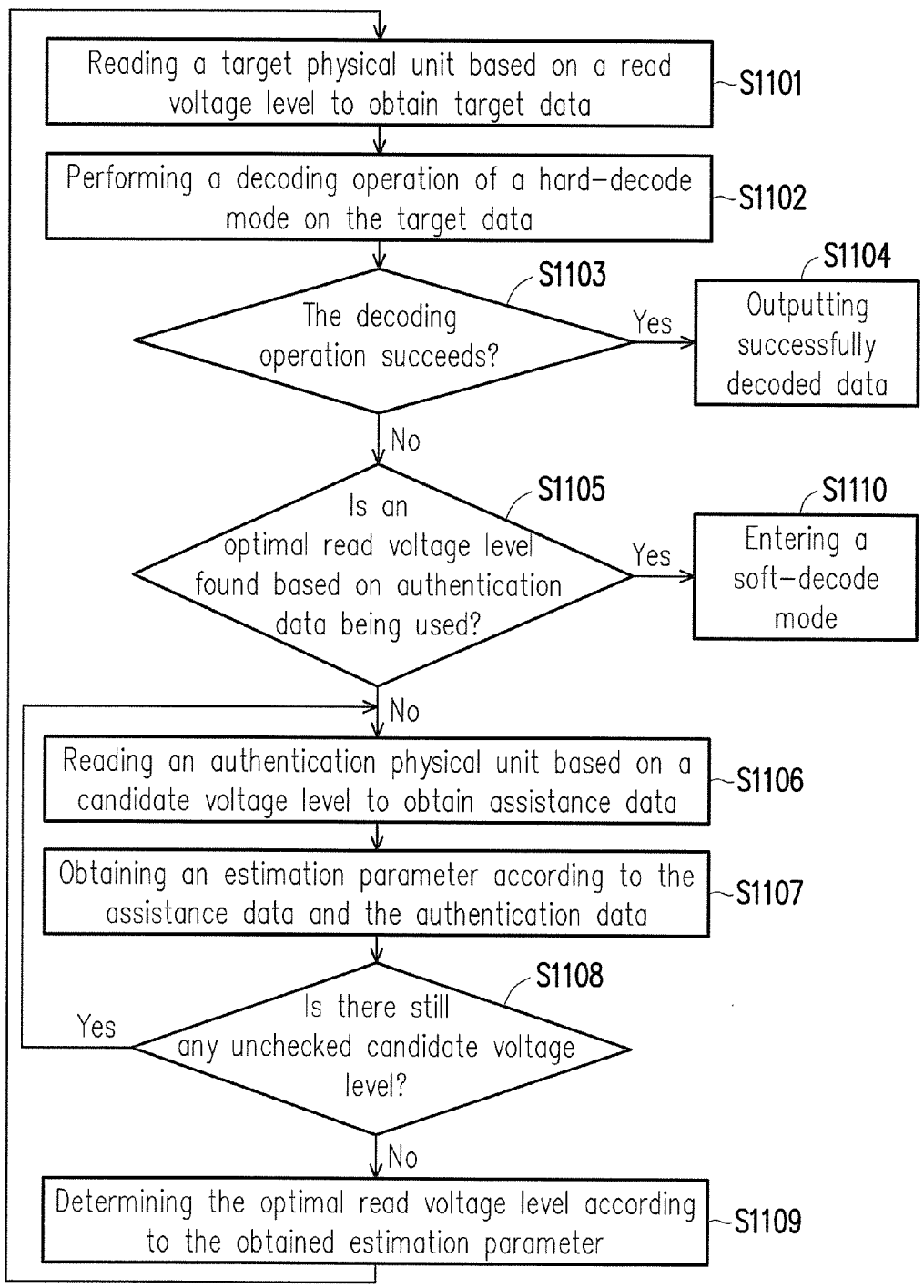
FIG. 11 is a flowchart illustrating a decoding method according to another exemplary embodiment of the disclosure.

FIG. 11 is a flowchart illustrating a decoding method according to another exemplary embodiment of the disclosure.

Referring to FIG. 11, in step S1101, a target physical unit is read based on a read voltage level to obtain target data. In step S1102, a decoding operation of a hard-decode mode is performed on the target data. In step S1103, whether the decoding operation succeeds (or fails) is determined. If the decoding operation succeeds, in step S1104, successfully decoded data is outputted. If the decoding operation does not succeed (i.e., fails), in step S1105, whether an optimal read voltage level found based on authentication data is used is determined. If the optimal read voltage level is not yet used, in step S1106, an authentication physical unit is read based on a candidate voltage level to obtain assistance data. In step S1107, an estimation parameter is obtained according to the assistance data and the authentication data. In step S1108, whether there is still any unchecked candidate voltage level is determined. If there is still any unchecked candidate voltage level (i.e., a determination result is "Yes" in step S1108), step S1106 and step S1107 are repeatedly performed until the assistance data corresponding to all the candidate voltage levels are obtained.

If all the candidate voltage levels are checked and the corresponding assistance data are obtained (i.e., the determination result is "No" in step S1108), in step S1109, the optimal read voltage level is determined according to the obtained estimation parameters. Then, in step S1101, the same target physical unit is read based on the optimal read voltage level to obtain the target data. In step S1102, the decoding operation of the hard-decode mode is performed on the target data. In step S1103, whether the decoding operation succeeds (or fails) is determined. If the decoding operation succeeds, in step S1104, the successfully decoded data is outputted. If the decoding operation does not succeed (i.e., fails), in step S1105, whether the optimal read voltage level found based on the authentication data is used is determined. Since the optimal read voltage level is already used, in step S1110, a soft-decode mode decoding is entered. The hard-decode mode decoding and the soft-decode mode decoding have been described above, which are not repeated hereinafter.

Figure 12:
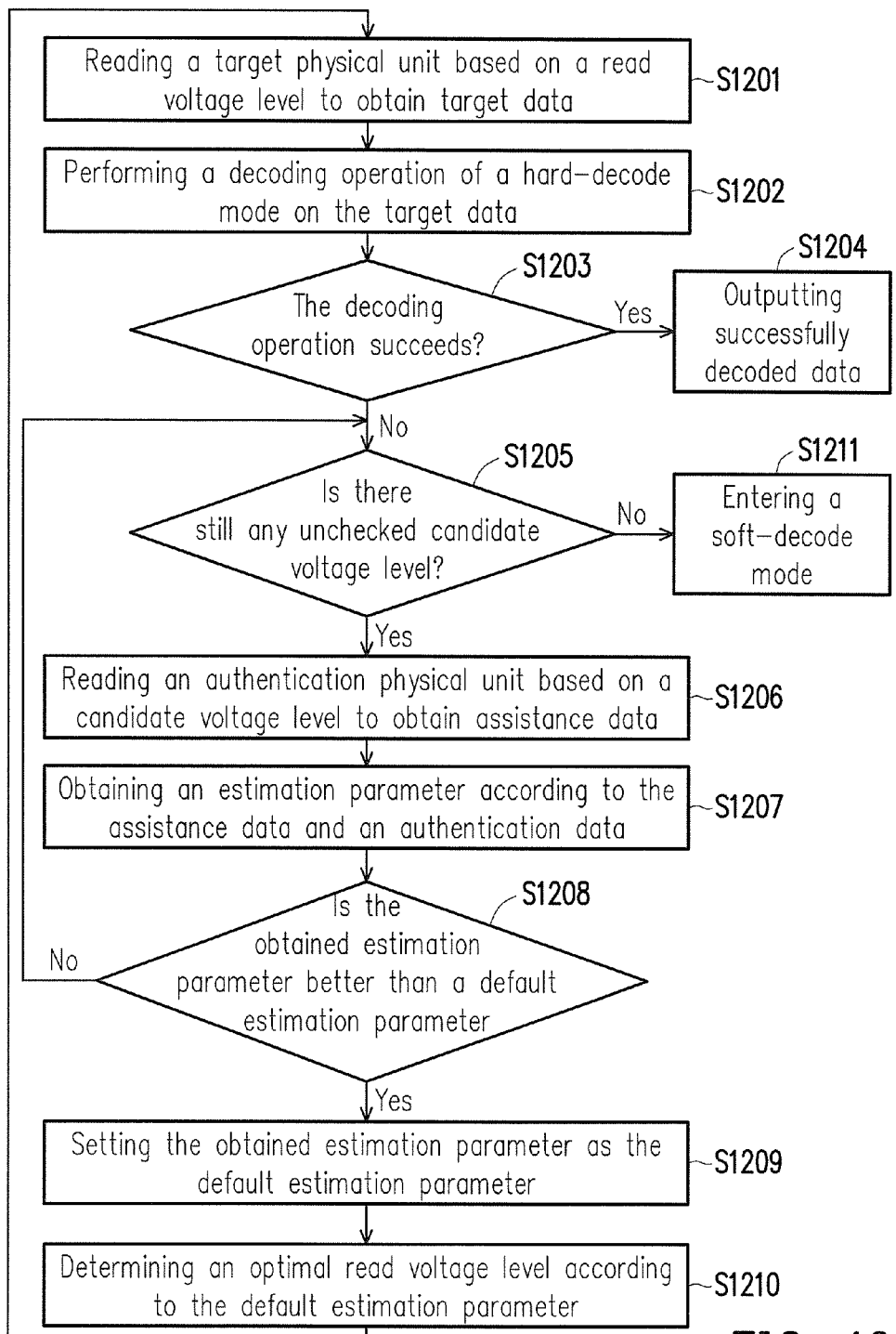
FIG. 12 is a flowchart illustrating a decoding method according to another exemplary embodiment of the disclosure.

FIG. 12 is a flowchart illustrating a decoding method according to another exemplary embodiment of the disclosure.

Referring to FIG. 12, in step S1201, a target physical unit is read based on a read voltage level to obtain target data. In step S1202, a decoding operation of a hard-decode mode is performed on the target data. In step S1203, whether the decoding operation succeeds (or fails) is determined. If the decoding operation succeeds, in step S1204, successfully decoded data is outputted. If the decoding operation does not succeed (i.e., fails), in step S1205, whether there is still any unchecked candidate voltage level is determined. If there is still any unchecked candidate voltage level (i.e., a determination result is "Yes" in step S1205), in step S1206, an authentication physical unit is read based on an unchecked candidate voltage level to obtain assistance data. In step S1207, an estimation parameter is obtained according to the assistance data and authentication data.

In step S1208, whether the estimation parameter obtained in step S1207 is better than a default estimation parameter is determined. Herein, one specific estimation parameter being better than the default estimation parameter means that the correctness of the assistance data corresponding to the specific estimation parameter is higher than the correctness of the assistance data corresponding to the default estimation parameter. For example, which one of the two assistance data has the higher correctness may be determined by comparing the flipping bit counts of the two. In addition, step S1209 may be directly performed when a candidate read voltage level is first time to be checked and the default estimation parameter is not yet being set. If an determination result is "No" in step S1208, it means that the correctness of the assistance data corresponding to the default estimation parameter is higher, and thus step S1205 is repeatedly performed after step S1208. If the determination result is "Yes" in step S1205, step S1206 to step S1208 are repeatedly performed. If the determination result is "Yes" in step S1208, it means that the correctness of the assistance data corresponding to the estimation parameter obtained in step S1207 is higher, and thus the obtained estimation parameter is set as the default estimation parameter in step S1209. In step S1210, an optimal read voltage level is determined according to the default estimation parameter.

Step S1201 is repeatedly performed after step S1210 so that the same target physical unit is read based on the optimal read voltage level. In step S1202, the decoding operation of the hard-decode mode is performed on the target data. In step S1203, whether the decoding operation succeeds (or fails) is determined. If the decoding operation succeeds, in step S1204, the successfully decoded data is outputted. If the decoding operation does not succeed (i.e., fails), in step S1205, whether there is still any unchecked candidate voltage level is determined. If yes, step S1206 and the steps so forth are repeatedly performed, and the related description thereof are not repeated hereinafter. If all the candidate voltage levels are checked and the corresponding assistance data are obtained (i.e., the determination result is "No" in step S1205), a soft-decode mode decoding is then entered in step S1211.

Nevertheless, each of steps depicted in FIG. 10 to FIG. 12 have been described in detail as above, and thus related description thereof is not repeated hereinafter. It should be noted that, the steps depicted in FIG. 10 to FIG. 12 may be implemented as a plurality of program codes or circuits, which are not particularly limited in the disclosure. Moreover, the methods disclosed in FIG. 10 to FIG. 12 may be implemented with reference to above embodiments, or may be implemented separately, which are not particularly limited in the disclosure.

In summary, a read voltage level is first used to read the target physical unit to obtain the target data and the target data is then decoded. If the decoding operation for the target data fails, multiple candidate voltage levels are used to read the authentication physical unit to obtain the corresponding assistance data. Then, multiple estimation parameters may be obtained after comparing multiple assistance data obtained in sequence with the authentication data originally being stored into the authentication physical unit. According to the obtained estimation parameters, another read voltage level is determined and used to read the same target physical unit again. As a result, the correctness of the read data may be improved and the decoding efficiency of the memory storage device may also be improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A decoding method for a rewritable non-volatile memory module comprising a plurality of physical units, the decoding method comprising:

sending a first read command sequence, via a memory interface, to instruct the rewritable non-volatile memory module reading a target physical unit among the physical units by using a first read voltage level to obtain first target data;

performing, by an error checking and correcting circuit, a first decoding operation on the first target data;

sending a first test command sequence, via the memory interface, to instruct the rewritable non-volatile memory module reading an authentication physical unit among the physical units by using a first candidate voltage level to obtain first assistance data and sending a second test command sequence, via the memory interface, to instruct the rewritable non-volatile memory module reading the authentication physical unit by using a second candidate voltage level to obtain second assistance data if the first decoding operation fails;

obtaining, by a memory management circuit, a first estimation parameter according to the first assistance data and authentication data and obtaining, by the memory management circuit, a second estimation parameter according to the second assistance data and the authentication data;

determining, by the memory management circuit, a second read voltage level according to the first estimation parameter and the second estimation parameter;

sending a second read command sequence, via the memory interface, to instruct the rewritable non-volatile memory module reading the target physical unit by using the second read voltage level to obtain second target data; and performing, by the error checking and correcting circuit, a second decoding operation on the second target data.

2. The decoding method of claim 1, wherein the first estimation parameter comprises a first flipping bit count, wherein the second estimation parameter comprises a second flipping bit count,
wherein the first flipping bit count corresponds to a total number of an error bit in the first assistance data, wherein the second flipping bit count corresponds to a total number of an error bit in the second assistance data.

3. The decoding method of claim 2, wherein the step of obtaining the first estimation parameter according to the first assistance data and the authentication data and obtaining the second estimation parameter according to the second assistance data and the authentication data comprises:
analyzing the first assistance data based on the authentication data to calculate the first flipping bit count; and
analyzing the second assistance data based on the authentication data to calculate the second flipping bit count.

4. The decoding method of claim 2, wherein the step of determining the second read voltage level according to the first estimation parameter and the second estimation parameter comprises:
determining the second read voltage level according to a value relationship between the first flipping bit count and the second flipping bit count.

5. The decoding method of claim 1, further comprising:
programming the authentication data into the authentication physical unit before reading the authentication physical unit based on the first candidate voltage level and reading the authentication physical unit based on the second candidate voltage level.

6. The decoding method of claim 1, wherein the target physical unit and the authentication physical unit belong to a same physical erasing unit.

7. The decoding method of claim 1, wherein both the first decoding operation and the second decoding operation belong to a hard-decode mode decoding.

8. A memory storage device, comprising:
a connection interface unit, configured to couple to a host system;
a rewritable non-volatile memory module comprising a plurality of physical units; and
a memory control circuit unit, coupled to the connection interface unit and the rewritable non-volatile memory module,
wherein the memory control circuit unit is configured to send a first read command sequence, via a memory interface, to instruct the rewritable non-volatile memory module reading a target physical unit among the physical units by using a first read voltage level to obtain first target data, wherein the memory control circuit unit is further configured to perform, by an error checking and correcting circuit, a first decoding operation on the first target data, wherein the memory control circuit unit is further configured to send a first test command sequence, via the memory interface, to instruct the rewritable non-volatile memory module reading an authentication physical unit among the physical units by using a first candidate voltage level to obtain first assistance data and send a second test command sequence, via the memory interface, to instruct the rewritable non-volatile memory module reading the authentication physical by using on a second candidate voltage level to obtain second assistance data if the first decoding operation fails, wherein the memory control circuit unit is further configured to obtain a first estimation parameter according to the first assistance data and authentication data and obtain a second estimation parameter according to the second assistance data and the authentication data, wherein the memory control circuit unit is further configured to determine a second read voltage level according to the first estimation parameter and the second estimation parameter, wherein the memory control circuit unit is further configured to send a second read command sequence, via the memory interface, to instruct the rewritable non-volatile memory module reading the target physical unit by using the second read voltage level to obtain second target data, wherein the memory control circuit unit is further configured to perform, by the error checking and correcting circuit, a second decoding operation on the second target data.

9. The memory storage device of claim 8, wherein the first estimation parameter comprises a first flipping bit count, wherein the second estimation parameter comprises a second flipping bit count,
wherein the first flipping bit count corresponds to a total number of an error bit in the first assistance data, wherein the second flipping bit count corresponds to a total number of an error bit in the second assistance data.

10. The memory storage device of claim 9, wherein the operation of obtaining the first estimation parameter according to the first assistance data and the authentication data and obtaining the second estimation parameter according to the second assistance data and the authentication data by the memory control circuit unit comprises:
analyzing the first assistance data based on the authentication data to calculate the first flipping bit count; and
analyzing the second assistance data based on the authentication data to calculate the second flipping bit count.

11. The memory storage device of claim 9, wherein the operation of determining the second read voltage level according to the first estimation parameter and the second estimation parameter by the memory control circuit unit comprises:
determining the second read voltage level according to a value relationship between the first flipping bit count and the second flipping bit count.

12. The memory storage device of claim 8, wherein the memory control circuit unit is further configured to send a write command sequence to instruct programming the authentication data into the authentication physical unit before sending the first test command sequence and the second test command sequence.

13. The memory storage device of claim 8, wherein the target physical unit and the authentication physical unit belong to a same physical erasing unit.

14. The memory storage device of claim 8, wherein both the first decoding operation and the second decoding operation belong to a hard-decode mode decoding.

15. A memory control circuit unit for controlling a rewritable non-volatile memory module comprising a plurality of physical units, wherein the memory control circuit unit comprises:
 a host interface, configured to couple to a host system;
 a memory interface, configured to couple to the rewritable non-volatile memory module;
 an error checking and correcting circuit; and
 a memory management circuit, coupled to the host interface, the memory interface and the error checking and correcting circuit,
 wherein the memory management circuit is configured to send a first read command sequence, via the memory interface, to instruct the rewritable non-volatile memory module reading a target physical unit among the physical units by using a first read voltage level to obtain first target data,
 wherein the error checking and correcting circuit is configured to perform a first decoding operation on the first target data,
 wherein the memory management circuit is further configured to send a first test command sequence, via the memory interface, to instruct the rewritable non-volatile memory module reading an authentication physical unit among the physical units by using a first candidate voltage level to obtain first assistance data and send a second test command sequence, via the memory interface, to instruct the rewritable non-volatile memory module reading the authentication physical unit by using a second candidate voltage level to obtain second assistance data if the first decoding operation fails,
 wherein the memory management circuit is further configured to obtain a first estimation parameter according to the first assistance data and authentication data and obtain a second estimation parameter according to the second assistance data and the authentication data,
 wherein the memory management circuit is further configured to determine a second read voltage level according to the first estimation parameter and the second estimation parameter,
 wherein the memory management circuit is further configured to send a second read command sequence, via the memory interface, to instruct the rewritable non-volatile memory module reading the target physical unit by using the second read voltage level to obtain second target data,
 wherein the error checking and correcting circuit is further configured to perform a second decoding operation on the second target data.

16. The memory control circuit unit of claim 15, wherein the first estimation parameter comprises a first flipping bit count, wherein the second estimation parameter comprises a second flipping bit count,
 wherein the first flipping bit count corresponds to a total number of an error bit in the first assistance data, wherein the second flipping bit count corresponds to a total number of an error bit in the second assistance data.

17. The memory control circuit unit of claim 16, wherein the operation of obtaining the first estimation parameter according to the first assistance data and the authentication data and obtaining the second estimation parameter according to the second assistance data and the authentication data by the memory management circuit comprises:
 analyzing the first assistance data based on the authentication data to calculate the first flipping bit count; and
 analyzing the second assistance data based on the authentication data to calculate the second flipping bit count.

18. The memory control circuit unit of claim 16, wherein the operation of determining the second read voltage level according to the first estimation parameter and the second estimation parameter by the memory management circuit comprises:
 determining the second read voltage level according to a value relationship between the first flipping bit count and the second flipping bit count.

19. The memory control circuit unit of claim 15, wherein the memory management circuit is further configured to send a write command sequence to instruct programming the authentication data into the authentication physical unit before sending the first test command sequence and the second test command sequence.

20. The memory control circuit unit of claim 15, wherein the target physical unit and the authentication physical unit belong to a same physical erasing unit.

21. The memory control circuit unit of claim 15, wherein both the first decoding operation and the second decoding operation belong to a hard-decode mode decoding.

* * * * *